(12) United States Patent
Mori et al.

(10) Patent No.: US 9,684,237 B2
(45) Date of Patent: Jun. 20, 2017

(54) CIRCUIT BOARD FORMATION USING ORGANIC SUBSTRATES

(71) Applicant: International Business Machines Corporation, Armonk, NY (US)

(72) Inventors: Hiroyuki Mori, Kawasaki (JP); Hirokazu Noma, Kawasaki (JP); Keishi Okamoto, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 14/817,378

(22) Filed: Aug. 4, 2015

(65) Prior Publication Data

US 2016/0057857 A1 Feb. 25, 2016

(30) Foreign Application Priority Data

Aug. 19, 2014 (JP) .................................. 2014-166328

(51) Int. Cl.
  *H05K 1/11* (2006.01)
  *G03F 7/00* (2006.01)
  (Continued)

(52) U.S. Cl.
  CPC .............. *G03F 7/0035* (2013.01); *G03F 7/38* (2013.01); *H05K 3/428* (2013.01); *H05K 3/4679* (2013.01);
  (Continued)

(58) Field of Classification Search
  CPC ... H05K 1/11; H05K 3/00; H05K 3/18; H05K 3/40; H05K 3/46; H01L 21/02; H01L 21/48; H01L 21/70
  (Continued)

(56) References Cited

U.S. PATENT DOCUMENTS 4,572,764 A * 2/1986 Fan ...................... H05K 3/0023
  156/235
4,631,111 A * 12/1986 Williston ................ G03F 7/095
  216/18

(Continued)

FOREIGN PATENT DOCUMENTS

JP 2003013313 A 1/2003
JP 2004040019 A 2/2004
(Continued)

OTHER PUBLICATIONS

Hiroyuki Mori et al., "Circuit Board Formation Using Organic Substrates", U.S. Appl. No. 14/950,673, filed Nov. 24, 2015.
(Continued)

*Primary Examiner* — Xiaoliang Chen
(74) *Attorney, Agent, or Firm* — Stosch Sabo

(57) ABSTRACT

A method of forming a circuit board includes forming a conductive pattern on a substrate; forming a first negative resist on the substrate after formation of the conductive pattern; partially exposing the first negative resist on the surface of the conductive pattern to form a first via exposure portion; forming a second negative resist on the substrate after formation of the first via exposure portion; partially exposing the second negative resist on the first via exposure portion to form a second via exposure portion larger than the first via exposure portion; developing the first negative resist and the second negative resist after formation of the second via exposure portion to form a via opening reaching the conductive pattern; and filling the via opening with a conductive material.

3 Claims, 3 Drawing Sheets

(51) Int. Cl.
*G03F 7/38* (2006.01)
*H05K 3/42* (2006.01)
*H05K 3/46* (2006.01)

(52) U.S. Cl.
CPC .............. *H05K 2201/09509* (2013.01); *H05K 2201/09563* (2013.01); *H05K 2201/09845* (2013.01); *H05K 2203/0577* (2013.01); *H05K 2203/0588* (2013.01); *H05K 2203/1453* (2013.01)

(58) Field of Classification Search
USPC ............ 174/264, 266; 430/285.1, 312, 314; 216/13, 18, 38, 52; 29/846, 852; 438/633
See application file for complete search history.

(56) References Cited

U.S. PATENT DOCUMENTS

| | | | | |
|---|---|---|---|---|
| 4,789,648 A | * | 12/1988 | Chow | H01L 21/304 216/52 |
| 5,266,446 A | * | 11/1993 | Chang | H01L 21/481 216/13 |
| 5,480,048 A | * | 1/1996 | Kitamura | H01L 21/4857 216/13 |
| 6,054,251 A | * | 4/2000 | Imai | G03F 7/031 430/195 |
| 2001/0025414 A1 | * | 10/2001 | Toyoshima | H05K 3/4661 29/852 |
| 2003/0157806 A1 | * | 8/2003 | Nagahara | G03F 7/0045 438/694 |
| 2010/0044095 A1 | * | 2/2010 | Kuczynski | H05K 1/115 174/266 |
| 2011/0204523 A1 | | 8/2011 | Arnold et al. | |

FOREIGN PATENT DOCUMENTS

| | | |
|---|---|---|
| JP | 2009094412 A | 4/2009 |
| JP | 2011003884 A | 1/2011 |

OTHER PUBLICATIONS

List of IBM Patents or Patent Applications Treated as Related; (Appendix P), Filed Feb. 24, 2016; 2 pages.

* cited by examiner

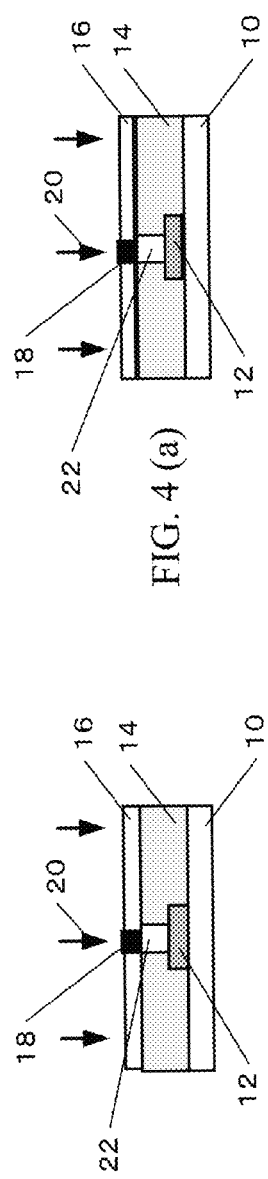
FIG. 3(a) (PRIOR ART)
FIG. 3(b) (PRIOR ART)
FIG. 3(c) (PRIOR ART)
FIG. 3(d) (PRIOR ART)
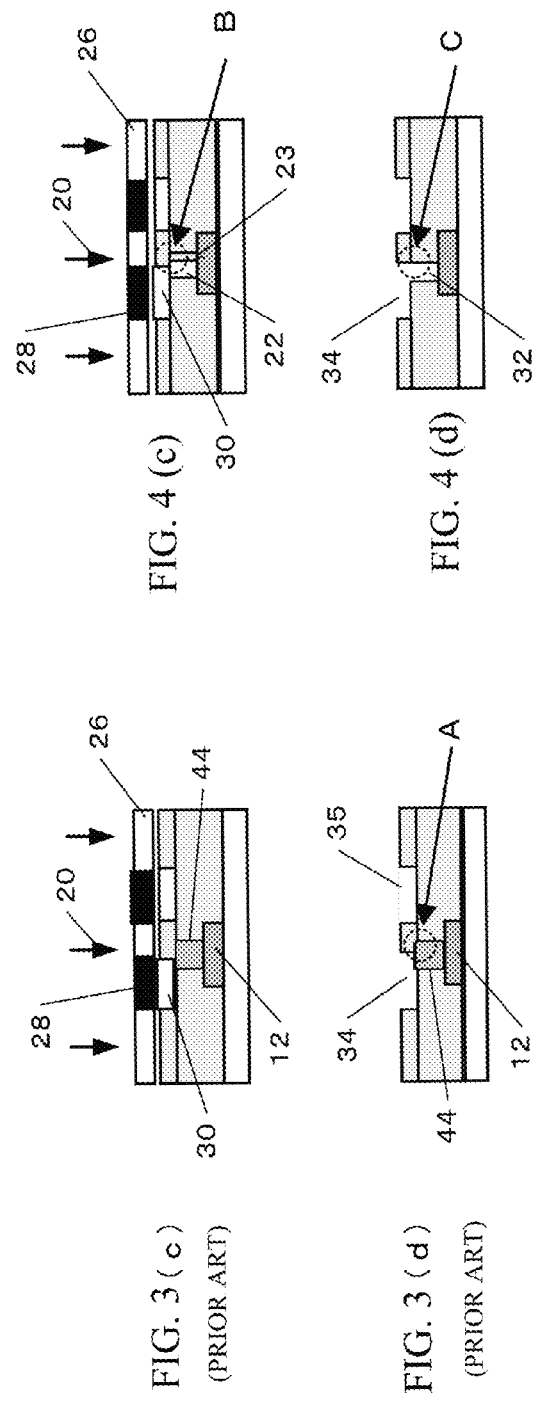
FIG. 4(a)
FIG. 4(b)
FIG. 4(c)
FIG. 4(d)

CIRCUIT BOARD FORMATION USING ORGANIC SUBSTRATES

FOREIGN PRIORITY

This application claims priority to Japanese Patent Application No. 2014-166328, filed Aug. 19, 2014, and all the benefits accruing therefrom under 35 U.S.C. §119, the contents of which in its entirety are herein incorporated by reference.

BACKGROUND

The present invention relates to a method of forming a circuit board and, more specifically, to a method of forming a circuit board including wiring with conductive vias.

Interposers with fine wiring are required in three-dimensional chip stacking and so-called 2.5-dimensional packages. An interposer establishes an electrical connection (relay) between mounted IC chips and between an IC chip and a wiring board. An interposer requires a wiring thickness that is not much thinner than the current thickness from the perspective of electrical characteristics. In other words, wiring with a high aspect ratio is required.

SUMMARY

In one aspect, a method of forming a circuit board includes forming a conductive pattern on a substrate; forming a first negative resist on the substrate after formation of the conductive pattern; partially exposing the first negative resist on the surface of the conductive pattern to form a first via exposure portion; forming a second negative resist on the substrate after formation of the first via exposure portion; partially exposing the second negative resist on the first via exposure portion to form a second via exposure portion larger than the first via exposure portion; developing the first negative resist and the second negative resist after formation of the second via exposure portion to form a via opening reaching the conductive pattern; and filling the via opening with a conductive material.

In another aspect, a circuit board includes a conductive pattern formed on a substrate; a first negative resist formed on the substrate and the conductive pattern; the first negative resist having a first via exposure portion formed on the surface of the conductive pattern; a second negative resist formed on the first negative resist having a first via exposure portion; the second negative resist having a second via exposure portion formed on the first via exposure portion, the second via exposure portion larger than the first via exposure portion; a via opening formed corresponding to the location of the first and second via exposure portions defined by concurrent development of the first and second negative resists, the via opening reaching the conductive pattern; and the via opening filled with a conductive material.

BRIEF DESCRIPTION OF THE DRAWINGS

FIGS. 2(a)-2(i) are a series of cross-sectional diagrams illustrating the individual operations described in FIG. 1, in which:

FIG. 2(a) illustrates a conductive pattern formed on a substrate;

FIG. 2(b) illustrates a first negative resist formed so as to cover the substrate and the surface of the conductive pattern;

FIG. 2(c) illustrates a photomask and the first negative resist exposed to light;

FIG. 2(d) illustrates a second negative resist formed to cover the surface of the exposed first negative resist over the entire substrate;

FIG. 2(e) illustrates light-shielding areas of the photomask provided to form unexposed areas in the second negative resist to form wiring;

FIG. 2(f) illustrates the development of formed via openings in the unexposed areas, and wiring openings in the unexposed areas;

FIG. 2(g) illustrates a seed layer formed on the surface of the first negative resist and the second negative resist including the surfaces of the via openings and the wiring openings;

FIG. 2(h) illustrates a conductive material formed on the seed layer using electroplating;

FIG. 2(i) illustrates the surfaces plated with the conductive material polished to remove the conductive material except for the conductive vias in the via openings and the wiring layer in the wiring openings;

FIGS. 3(a)-3(d) are series of cross-sectional views illustrating a conventional circuit board formation process, in which:

FIG. 3(a) illustrates first via exposure portions formed in the first negative resist;

FIG. 3(b) illustrates an opening formed by the developed first via exposure portion filled with a conductive layer to form a conductive via, and the second negative resist formed after the conductive via;

FIG. 3(c) illustrates the wiring portion of the second negative resist exposed using a misaligned photomask;

FIG. 3(d) illustrates development of the second negative resist which exposes the surface of the conductive via and comes into contact with an adjacent wiring opening, result in a short circuit;

FIGS. 4(a)-4(d) are series of additional cross-sectional views of the method in FIGS. 1 and 2(a)-2(i), for comparison with FIGS. 3(a)-3(d), in which:

FIG. 4(a) illustrates first via exposure portions formed in the first negative resist;

FIG. 4(b) illustrates the second negative resist formed before development of the exposed first negative resist;

FIG. 4(c) illustrates exposure of the wiring portion of the second negative resist using a misaligned photomask during simultaneous development of the first negative resist and the second negative resist; and FIG. 4(d) illustrates the resulting narrow via opening such that there is no contact with the adjacent wiring opening, resulting in a short circuit less likely to occur.

DETAILED DESCRIPTION

Interposers are currently made primarily using a silicon substrate; however, they are expensive and this limits their use. If interposers could be created using an organic substrate made of an organic material, these costs could be reduced and their application could promote the spread of three-dimensional stacking.

Unfortunately, interposers created with an organic substrate using the methods of the prior art experience certain problems. For example, the dimensions of each type of pattern tend to be unstable due to the properties of organic materials. In addition, exposure and development processes are repeated multiple times, which makes the manufacturing process more complicated. Accordingly, there is a need to solve this problem associated with the creation of organic substrates by providing a method of creating a circuit board with more applications (including wiring board and interposer) even when an organic substrate is used.

A method of creating a circuit board is provided in one aspect of the present invention. This method includes forming a conductive pattern on a substrate; forming a first negative resist on the substrate after formation of the conductive pattern; partially exposing the first negative resist on the surface of the conductive pattern to form a first via exposure portion; forming a second negative resist on the substrate after formation of the first via exposure portion; partially exposing the second negative resist on the first via exposure portion to form a second via exposure portion larger than the first via exposure portion; developing the first negative resist and the second negative resist after formation of the second via exposure portion to form a via opening reaching the conductive pattern; and filling the via opening with a conductive material.

In one aspect of the present invention, simultaneous development of the two negative resists (the first negative resist and the second negative resist) does not remove the two negative resists but rather forms a permanent resist (interlayer insulating layer) which significantly reduces the number of production steps for circuit boards containing conductive vias.

In one aspect of the present invention, forming the second via exposure portion includes simultaneously partially exposing the second negative resist outside of the first via exposure portion to form a conductive wiring exposure portion; forming a via opening reaching the conductive pattern includes simultaneously forming a wiring opening in the second negative resist; and the step of filling the opening with a conductive material includes simultaneously filling the wiring opening with the conductive material.

In one aspect of the present invention, simultaneous formation of the conductive vias and wiring further reduces the number of production steps for circuit boards containing conductive vias, and short circuiting caused by misalignment of conductive vias and wiring can be avoided.

Figure 1:
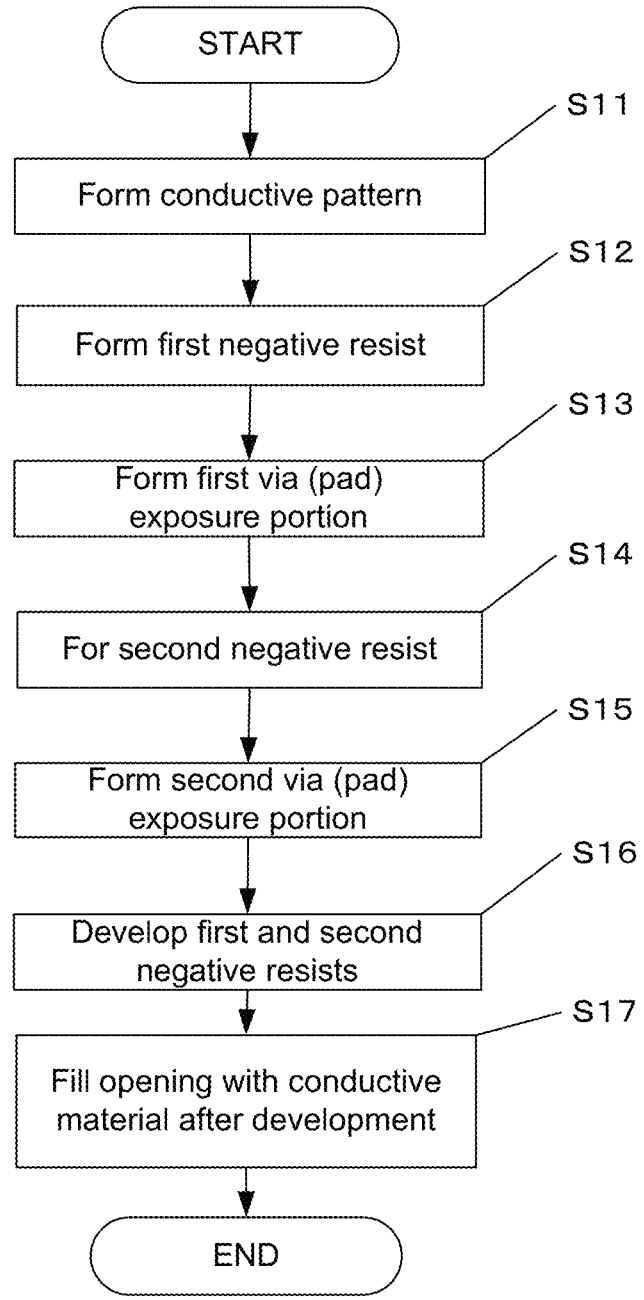
FIG. 1 is a flowchart of a method of forming a circuit board in accordance with an exemplary embodiment of the present invention.

The following is an explanation of an embodiment of the present invention with reference to the drawings. FIG. 1 is a flowchart of a method of forming a circuit board in accordance with an exemplary embodiment of the present invention. FIGS. 2(a)-2(i) are a series of cross-sectional diagrams illustrating the individual operations described in FIG. 1. The following is an explanation of the exemplary method of the present invention and a circuit board obtained using this method with reference to FIG. 1 and FIGS. 2(a)-2(i).

Figure 2A:
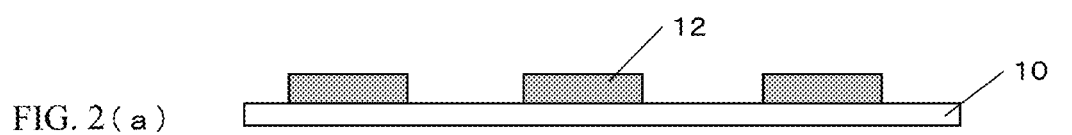

In operation S11 of FIG. 1, a conductive pattern is formed on a substrate. As shown in FIG. 2(a), a conductive pattern 12 is formed on the material (base material) of a substrate 10. The base material can be organic or inorganic insulating material or a semiconducting material such as silicon. The conductive pattern 12 can be obtained by forming a seed layer and patterned resist on the substrate 10, forming a conductive layer such as a copper layer using electroplating, and then removing/etching the remaining resist and seed layer.

Figure 2B:
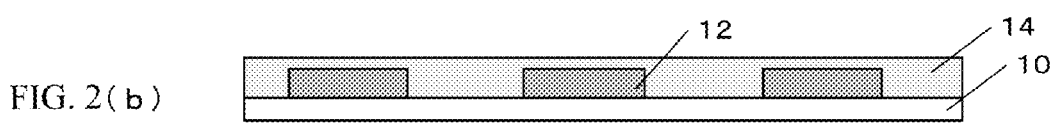

In operation S12, a first negative resist is formed on the substrate 10 with the formed conductive pattern 12. As shown in FIG. 2(b), a first negative resist 14 is formed so as to cover the substrate 10 and the surface of the conductive pattern 12. The first negative resist 14 is a so-called negative type photoresist, and is made of a photosensitive material whose exposed portions remain altered. The first negative resist 14 can be formed by using a conventional application technique (spin coating, etc.) using a photosensitive material (resin, polymer material).

Figure 2C:
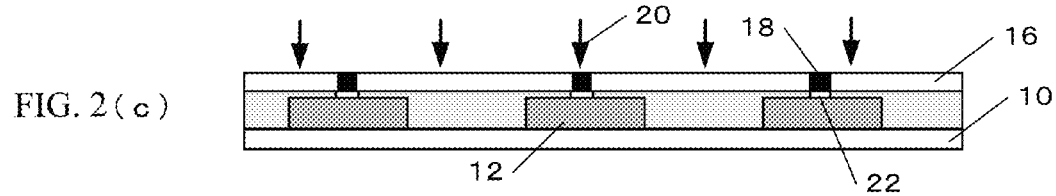

In operation S13, a first via exposure portion is formed in the first negative resist 14. As shown in FIG. 2(c), a photomask 16 including unexposed (light-shielding) areas 18 is disposed on the substrate 10, and the first negative resist 14 is exposed to light 20. The photomask 16 is positioned so that the light-shielding areas 18 are directly above the photoresist pattern 12.

The areas 22 of the first negative resist 14 beneath the light-shielding areas 18 of the photomask 16 are not exposed, and these are removed in a subsequent development step (S16) to form first via areas. One characteristic of the method of the present invention is that the first negative resist 14 is not developed immediately after exposure. Direct exposure using a laser beam (laser direct imaging) may be used instead of using a photomask 16.

Figure 2D:
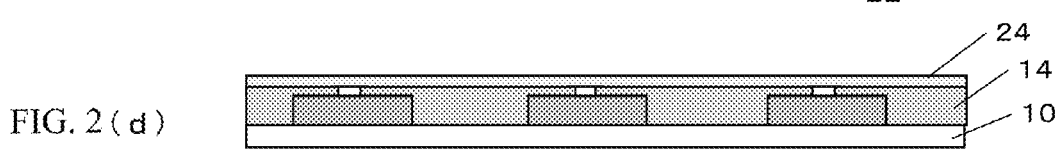

In operation S14, a second negative resist is formed on top of the first negative resist 14 after exposure. As shown in FIG. 2(d), the second negative resist 24 is formed so that it covers the surface of the exposed first negative resist 14 over the entire substrate 10. The second negative resist 24 can be the same negative type photoresist used for the first negative resist 14, and the same method of formation can be used.

Figure 2E:
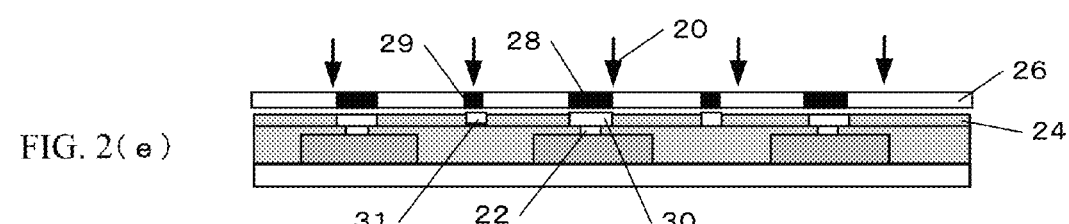

In operation S15, second via exposure portions are formed in the second negative resist 24. As shown in FIG. 2(e), a photomask 26 including light-shielding areas 28 is disposed on the substrate 10, and the second negative resist 24 is exposed to light 20. The photomask 26 is positioned so that the light-shielding areas 28 are directly above the unexposed areas 22 of the first negative resist 14.

The areas 30 of the second negative resist 24 beneath the light-shielding areas 28 of the photomask 26 are not exposed, and these are removed in a subsequent development operation (S16) to form second via (pad) areas on top of the first via areas. A dual damascene structure made of first via exposure areas and second via (pad) exposure areas can be obtained by making the size (inner diameter) of the light-shielding areas 28 of photomask 26 larger than that of the light-shielding areas 18 of photomask 16.

In operation S15, an area to become wiring (conductive pattern) can be exposed at the same time that the second via (pad) exposure portions are formed (exposed). In FIG. 2(e), light-shielding areas 29 of the photomask 26 are provided to form unexposed areas 31 in the second negative resist 24 to form wiring. One characteristic of the method of the present invention is that second via (pad) exposure and wiring exposure are performed at the same time. As explained below with reference to FIG. 3, this can also reduce the likelihood of short circuiting caused by misalignment during exposure.

Figure 2F:
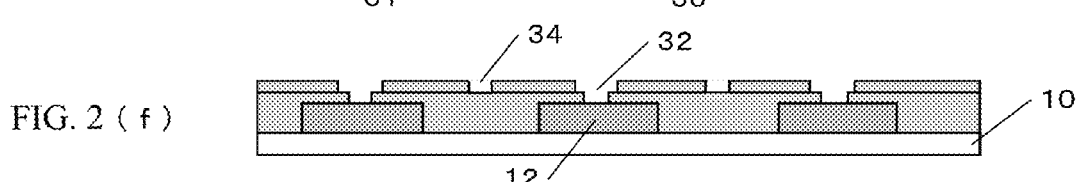

In operation S16, the exposed first negative resist 14 and second negative resist 24 are developed using a developer. As shown in FIG. 2(f), the development formed via openings 32 in the unexposed areas 22 and 30, and wiring openings 34 in unexposed area 31. The via openings 32 reach the surface of the conductive pattern 12.

One characteristic of the exemplary method in the present invention is that the first negative resist 14 and the second negative resist 24 are not removed but remain to form a permanent resist that functions as an interlayer insulating layer. This reduces the number of development steps and also eliminates the resist removal step.

Figure 2G:
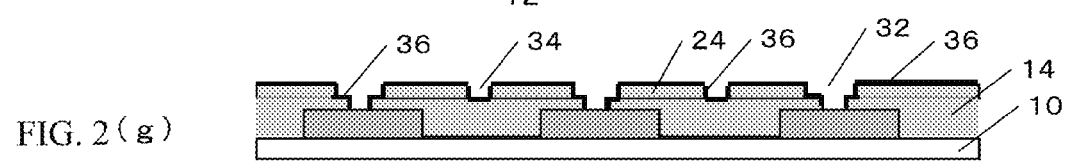
Figure 2H:
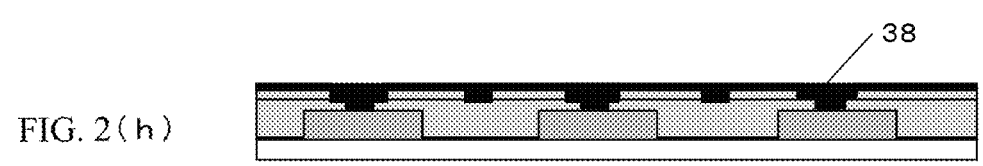
Figure 2I:
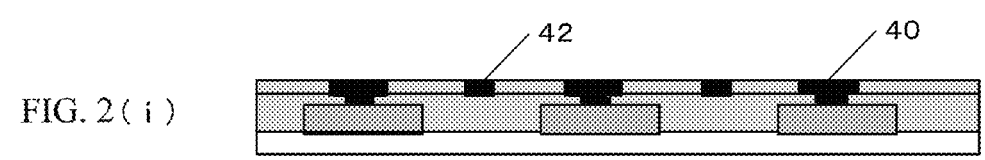

In operation S17, the via openings 32 and wiring openings 34 formed after development are filled with a conductive material (conductors). An example using a plating method is shown in FIG. 2(g) through 2(i). In FIG. 2(g), a seed layer 36 is formed on the surface of the first negative resist 14 and the second negative resist 24 including the surfaces (inner surfaces) of the via openings 32 and the wiring openings 34. In FIG. 2(h), conductive material (a conductive layer) 38 is formed on the seed layer 36 using electroplating. In this way, the via openings 32 and wiring openings 34 are filled with the conductive material. An example of a conductive material that can be used is copper.

In FIG. 2(i), the surfaces plated with the conductive material 38 are polished to remove the conductive material 38 except for the conductive vias 40 in the via openings 32 and the wiring layer 42 in the wiring openings 34, and to flatten the polished surface. The polishing can be performed using chemical mechanical polishing (CMP) or some other polishing method. For example, an electrodeposition resist can be formed on the conductive material 38 in FIG. 2(h), the surface of the electrodeposition resist can be buffed or chemically etched to flatten the surface, and similar flattening can then performed by removing the remaining electrodeposition resist.

A circuit board structure in which a plurality of the structures shown in FIG. 2(i) have been stacked can be obtained by forming an insulating layer of an organic material on the flattened structure in FIG. 2(i) obtained by performing operations S11 through S17 in FIG. 1 and then repeating operations S11 through S17. A single or stacked circuit board structure can be used as a single circuit board or as a so-called interposer to provide electrical relays between circuit boards or between a circuit board and a semiconductor chip.

The following is an explanation of the advantages of the present invention with reference to FIGS. 3(a)-3(d) and FIGS. 4(a)-4(d). FIGS. 3(a)-3(d) show the processes in the f the prior art in which the via portions and the wiring portions are formed (exposed) separately. In contrast, FIGS. 4(a)-4(d) again show the processes in the method of the present invention in which the via portions and the wiring portions are formed (exposed) simultaneously. FIG. 3(a) of the prior art is the same as FIG. 4(a) of the present invention, and also corresponds to FIG. 2(c). In other words, first via exposure portions (actually unexposed areas) 22 are formed in the first negative resist 14.

In FIG. 3(b), the first via exposure portion 22 formed in FIG. 3(a) is developed to form an opening, the opening is filled with a conductive layer to form a conductive via 44, and the second negative resist 24 is formed. Here, the second resist 24 is formed after the conductive via 44 has been formed. In contrast, FIG. 4(b) of the present invention, as explained above with reference to FIG. 2(d), development or formation of the opening is not performed immediately after the first via exposure portion 22 has been formed.

In FIG. 3(c), the wiring portion of the second negative resist 24 is exposed using a photomask 26. Unexposed areas 30 are formed by the light-shielding portions 28 of the photomask 26. Here, the photomask 26 is misaligned and one of these areas 30 is formed directly above the conductive via 44. Therefore, when the second negative resist 24 is developed, the wiring opening 34 after development exposes the surface of the conductive via 44 as shown in FIG. 3(d), and the conductive via 44 comes into contact with an adjacent wiring opening 35 (see the dotted-line circle indicated by arrow A). As a result, a short circuit later may occur between the conductive layer (wiring layer) filling the wiring opening 35 and the conductive via 44.

However, in the present process, as shown in FIG. 4(c), when exposure of the wiring portion of the second negative resist 24 occurs using a photomask 26, in the event the photomask 26 is misaligned, and one of the areas 30 is formed directly above an exposure area 22 of the via portion, the right side 23 of the first via exposure portion (actually an unexposed area) 22 of the first negative resist 14 is exposed (see the dotted-line circuit indicated by arrow B). As a result, as shown in FIG. 4(d), during simultaneous development of the first negative resist 14 and the second negative resist 24, the via opening 32 is narrow (see the dotted-line circuit indicated by arrow C) so there is no contact with the adjacent wiring opening 35. As a result, a short circuit is less likely to occur later between the conductive layer (wiring layer) filling the wiring opening 35 and the conductive layer (conductive via) filling the via opening 32.

Here, the conductive via formed in the opening 32 has a so-called landless via structure. In order to take into account the narrowing of the width (diameter) of the via opening 32 and avoid an increase in electrical resistance in the conductive via, the width (diameter) of the first via exposure portion 22 may be increased to ensure that the conductive via has the desired width (diameter).

Embodiments of the present invention were explained above with reference to the drawings. However, the present invention is not limited to these embodiments. In addition, the present invention can be embodied in many different ways, including improvements and modifications as well as changes, based on knowledge common in the art without departing from the spirit and scope of the claims.

REFERENCE SIGNS LIST

10: Board (material, substrate)
12: Conductive pattern
14, 24: Negative resist
16, 26: Photomask
18, 28: Light-shielding area
22, 30: Unexposed area
23: Exposed area
32, 34, 35: Opening
36: Seed layer
38: Plated layer
40, 44: Conductive via (pad)
42: Wiring layer

The invention claimed is:
1. A circuit board, comprising:
a conductive pattern formed on a substrate;
a first negative resist formed on the substrate and the conductive pattern;
the first negative resist having a first via exposure portion formed on the surface of the conductive pattern;
a second negative resist formed on the first negative resist having the first via exposure portion;
the second negative resist having a second via exposure portion formed on the first via exposure portion, the second via exposure portion larger than the first via exposure portion, the first via exposure portion comprising a first sub-portion that overlaps the second via exposure portion and a second sub-portion that does not overlap the second via exposure portion;
a via opening formed corresponding to the location of the first and second via exposure portions defined by concurrent development of the first and second negative resists such that the second via exposure portion is unexposed, and such that the first sub-portion of the first via exposure portion is unexposed, and such that the second sub-portion of the first via exposure portion is exposed, the via opening reaching the conductive pattern; and the via opening filled with a conductive material.

2. The circuit board of claim 1, wherein the first negative resist and the second negative resist are used as interlayer insulating layers in the circuit board.

3. The circuit board of claim 1, wherein the substrate is an organic substrate, and the circuit board comprises an interposer.

* * * * *